United States Patent
Mok et al.

(10) Patent No.: US 7,841,074 B2
(45) Date of Patent: Nov. 30, 2010

(54) METHOD OF FABRICATING PASTE BUMP FOR PRINTED CIRCUIT BOARD

(75) Inventors: Jee Soo Mok, Gyunggi-do (KR); Jun Heyoung Park, Gyunggi-do (KR); Ki Hwan Kim, Gyunggi-do (KR); Sung Yong Kim, Gyunggi-do (KR); Sang Hyun Park, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 195 days.

(21) Appl. No.: 12/005,353

(22) Filed: Dec. 27, 2007

(65) Prior Publication Data

US 2008/0307641 A1 Dec. 18, 2008

(30) Foreign Application Priority Data

Jun. 12, 2007 (KR) ...................... 10-2007-0057370

(51) Int. Cl.
*H01R 43/00* (2006.01)
(52) U.S. Cl. .............................. 29/755; 29/842; 29/846
(58) Field of Classification Search ................... 29/829, 29/830, 831, 884, 842, 846, 755; 174/262; 438/612; 427/468
See application file for complete search history.

(56) References Cited

U.S. PATENT DOCUMENTS 6,709,966 B1 * 3/2004 Hisatsune et al. .......... 438/613
6,889,433 B1 * 5/2005 Enomoto et al. ............. 29/852
7,422,973 B2 * 9/2008 Shiu et al. .................. 438/612

FOREIGN PATENT DOCUMENTS

| JP | 2001-230537 | | 8/2001 |
| JP | 2001230537 A | * | 8/2001 |
| JP | 2003298215 A | * | 10/2003 |
| KR | 657406 | * | 12/2006 |

OTHER PUBLICATIONS

Korean Patent Office Action, mailed May 26, 2008 and issued in corresponding Korean Patent Application No. 10-2007-0057370.

* cited by examiner

*Primary Examiner*—Derris H Banks
*Assistant Examiner*—Azm Parvez

(57) ABSTRACT

A method of fabricating a paste bump for a printed circuit board, provides preparing a base plate; printing a conductive paste on the base plate and drying the conductive paste on the base plate, thus forming a first paste bump; flattening an upper surface of the first paste bump through coining; and printing a conductive paste on the first paste bump and drying the conductive paste on the first bump, thus forming a second paste bump, wherein the printing a conductive paste on the base plate and drying the conductive paste on the base plate includes placing a first mask having a hole having a first size on the base plate; applying a conductive paste on the first mask, and pressing the conductive paste using a squeegee; filling the hole having a first size in the first mask with the conductive paste, and sticking a bottom of the conductive paste to the base plate; and removing the first mask and drying the conductive paste, thus forming the first paste bump.

13 Claims, 3 Drawing Sheets

METHOD OF FABRICATING PASTE BUMP FOR PRINTED CIRCUIT BOARD

CROSS REFERENCE TO RELATED APPLICATION

This application claims the benefit of Korean Patent Application No. 10-2007-0057370, filed on Jun. 12, 2007, entitled "Fabricating method of paste bump for printed circuit board", which is hereby incorporated by reference in its entirety into this application.

BACKGROUND OF THE INVENTION

1. Field of the Invention

The present invention relates, in general, to a method of fabricating a paste bump for a printed circuit board (PCB), and more particularly, to a method of fabricating a paste bump for a PCB, which enables the number of printings to be decreased, to thus reduce the fabrication cost and process time in the formation of the paste bump on the PCB.

2. Description of the Related Art

In order to realize high-density PCBs with the development of electronic components, there is a demand for techniques for improving the performance of HDI (High Density Interconnection) substrates to which the interlayer electrical connection of circuit patterns and micro-circuit wiring are applied. Specifically, improvement in the performance of the HDI substrate requires techniques for ensuring the interlayer electrical connection of circuit patterns and the freedom of design thereof.

Conventionally, a multilayer PCB is fabricated by forming inner circuits on the surfaces of a core substrate, for example, a copper clad laminate (CCL), through an additive method or a subtractive method, sequentially building up insulating layers and circuit layers, and forming outer circuits through the same method as for the inner circuits.

However, such a conventional process of fabricating the multilayer PCB does not satisfy requests for low costs due to a fall in the price of the application products thereof, including mobile phones, and for a reduction in lead-time to increase mass production, and thus a novel fabrication process that is able to solve these problems is required.

In order to simplify the complicated process of the prior art and to rapidly and inexpensively fabricate a multilayer PCB using a collective lamination procedure, so-called B2it (Buried Bump Interconnection Technology) has been commercialized, which allows simple and convenient lamination by printing a conductive paste on a copper foil to thus form bumps, and laminating an insulation element thereon to prefabricate a paste bump board.

FIG. 1 is a flowchart illustrating the process of fabricating a paste bump for a PCB according to a conventional technique, and FIG. 2 is a view illustrating the shape of the paste bump formed using the process of fabricating a paste bump for a PCB, as illustrated in FIG. 1, according to a conventional technique.

With reference to FIGS. 1 and 2, a base plate 100 on which a paste bump 200 is to be formed is prepared, after which a mask having a hole is placed on the portion of the base plate 100 at which the paste bump 200 is to be formed.

Next, a conductive paste is applied on the mask, and is then pressed using a squeegee so that the hole in the mask is filled with the conductive paste (S100).

As such, the conductive paste is stuck to the base plate by the pressure of the squeegee.

Next, the conductive paste printed on the base plate 100 is dried (S200).

Accordingly, as seen in FIG. 2, the paste bump 200 having a first height h1 is formed.

Because the conductive paste has high viscosity and low TI, printing and drying of the conductive paste are repeated 4~5 times after a single printing of the conductive paste, thus forming the paste bump 200 having a predetermined height H.

In order to form a paste bump 200 having a desired height H through the method of fabricating the paste bump for a PCB according to a conventional technique, printing and drying of a conductive paste having high viscosity and low TI are repeated several times, and thereby the process time required to form the paste bump for a PCB is increased, undesirably decreasing productivity.

Further, because printing and drying of the conductive paste are repeated several times, the conductive paste, a large amount of which is placed in the hole in the mask, must be pressed upon printing of the conductive paste, undesirably increasing the fabrication cost required to form the paste bump for a PCB.

SUMMARY OF THE INVENTION

Accordingly, the present invention provides a method of fabricating a paste bump for a PCB, which can decrease the number of printings to thus reduce the fabrication cost and process time required to form the paste bump on the PCB.

According to the present invention, a method of fabricating a paste bump for a PCB may include a) preparing a base plate; b) printing a conductive paste on the base plate and drying it, thus forming a first paste bump; c) flattening the upper surface of the first paste bump through coining; and d) printing a conductive paste on the first paste bump and drying it, thus forming a second paste bump.

In the method of fabricating the paste bump according to the present invention, the b) may include b-1) placing a first mask having a hole having a first size on the base plate; b-2) applying a conductive paste on the first mask, and pressing the conductive paste using a squeegee; b-3) filling the hole having a first size in the first mask with the conductive paste, and sticking the bottom of the conductive paste to the base plate; and b-4) removing the first mask and drying the conductive paste, thus forming the first paste bump.

In the method of fabricating the paste bump according to the present invention, the d) may include d-1) placing a second mask having a hole having a second size on the first paste bump; d-2) applying a conductive paste on the second mask, and pressing the conductive paste using a squeegee; d-3) filling the hole having a second size in the second mask with the conductive paste, and sticking the bottom of the conductive paste to the upper surface of the first paste bump; and d-4) removing the second mask, and drying the conductive paste, thus forming the second paste bump.

In the method of fabricating the paste bump according to the present invention, the hole in the second mask may have a size smaller than or equal to the hole in the first mask.

In the method of fabricating the paste bump according to the present invention, the second mask may have a height lower than or equal to that of the first mask.

In the method of fabricating the paste bump according to the present invention, the base plate may be a laminate in which a circuit pattern is formed on one surface of an insulating layer.

In the method of fabricating the paste bump according to the present invention, the base plate may be a laminate in which a circuit pattern is formed on each of both surfaces of an insulating layer.

In the method of fabricating the paste bump according to the present invention, the base plate may be a metal carrier having a copper foil laminated on one surface thereof.

In the method of fabricating the paste bump according to the present invention, the base plate may be a copper foil.

In the method of fabricating the paste bump according to the present invention, the second paste bump may have a height lower than or equal to that of the first paste bump.

BRIEF DESCRIPTION OF THE DRAWINGS

The features and advantages of the present invention will be more clearly understood from the following detailed description taken in conjunction with the accompanying drawings, in which.

DESCRIPTION OF THE PREFERRED EMBODIMENTS

Unless otherwise defined, all terms used herein have the same meaning as commonly understood by one having ordinary skill in the art to which the present invention belongs. It will be further understood that terms, such as those defined in commonly used dictionaries, should be interpreted as having meanings consistent with their meanings in the context of the relevant art, and are not to be interpreted in an idealized or overly formal sense unless expressly so defined herein.

Hereinafter, a detailed description will be given of a method of fabricating a paste bump for a PCB, according to the present invention, with reference to the appended drawings.

Figure 1:
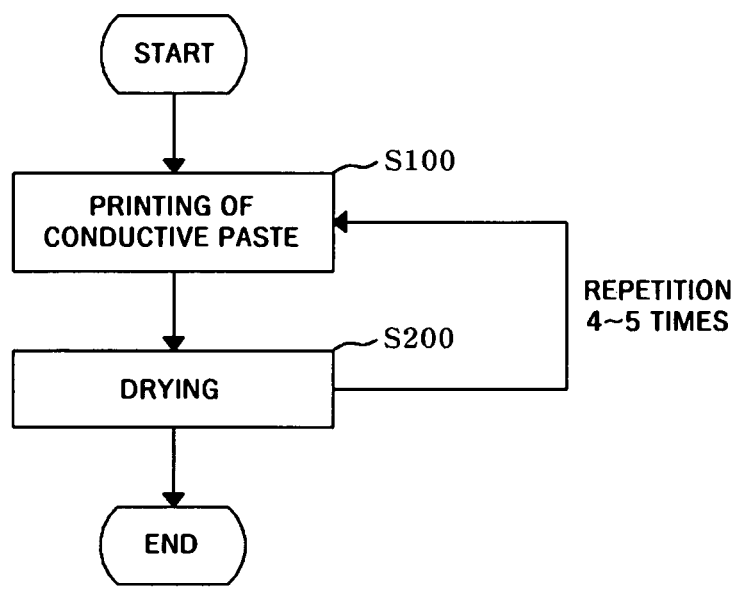
FIG. 1 is a flowchart illustrating the process of fabricating a paste bump for a PCB according to a conventional technique.
Figure 2:
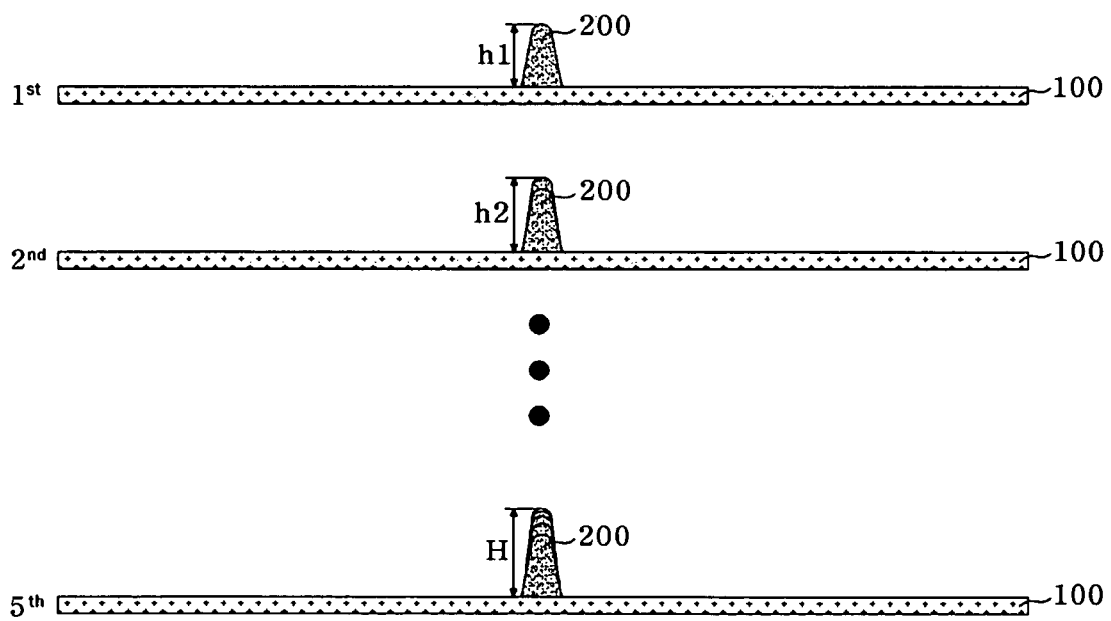
FIG. 2 is a view illustrating the shape of the paste bump formed using the process of fabricating a paste bump for a PCB, as illustrated in FIG. 1, according to a conventional technique.
Figure 3:
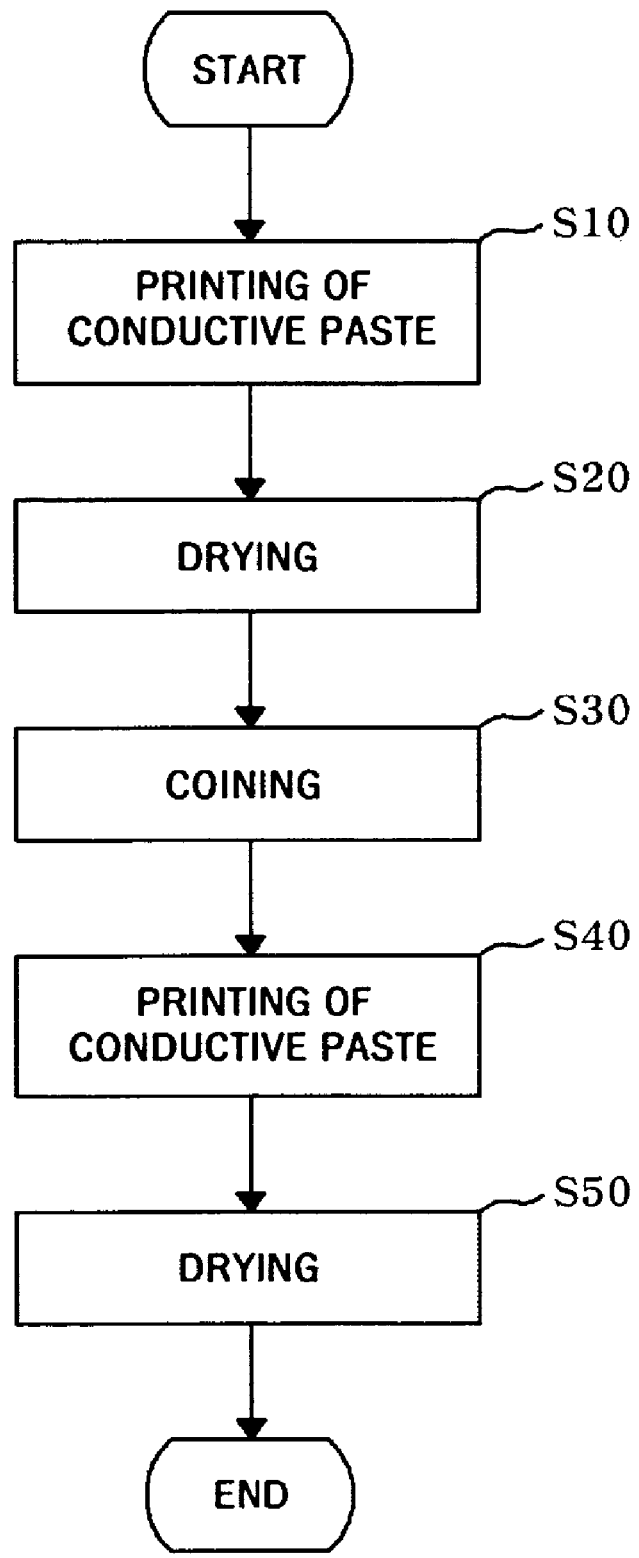
FIG. 3 is a flowchart illustrating the process of fabricating a paste bump for a PCB, according to the present invention.
Figure 4:
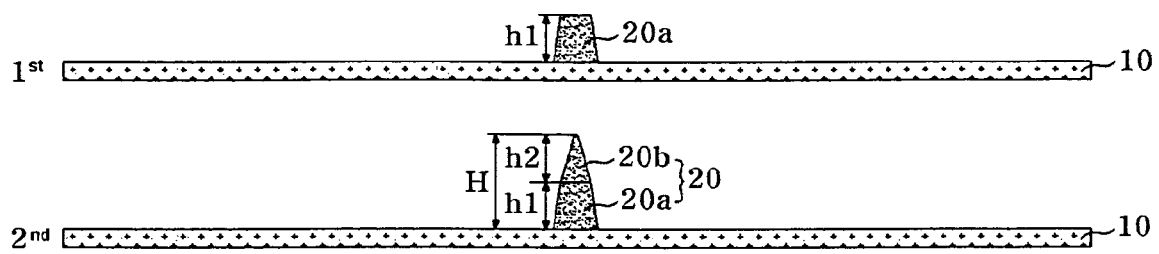
FIG. 4 is a view illustrating the shape of the paste bump for a PCB formed using the process of fabricating a paste bump for a PCB, as illustrated in FIG. 3, according to the present invention.

FIG. 3 is a flowchart illustrating the process of fabricating a paste bump for a PCB, according to the present invention, and FIG. 4 is a view illustrating the shape of the paste bump formed using the process of fabricating a paste bump for a PCB, as illustrated in FIG. 3, according to the present invention.

As illustrated in FIGS. 3 and 4, in the method of fabricating a paste bump for a PCB, according to the present invention, a base plate 10, on which a paste bump 20 is to be formed, is prepared.

Examples of the base plate 10 include a CCL in which a circuit pattern is formed on one surface or both surfaces of an insulating layer, a copper foil, or a metal carrier having a copper foil laminated on one surface thereof.

Among the examples of the base plate 10, the base plate 10, in which a circuit pattern is formed on one surface or both surfaces of an insulating layer, may be manufactured through any one of the following methods.

As a first method, on the copper foil of a single-sided CCL (e.g., RCC), in which a copper foil is laminated on one surface or both surfaces of an insulating layer, a dry film (not shown) is applied, after which the portion of the dry film, other than the portion of the dry film corresponding to a circuit pattern, is removed through exposure and development.

Subsequently, the copper foil is etched using an etchant, thus forming the circuit pattern, after which the dry film remaining on the circuit pattern is removed.

As a second method, an electroless copper plating layer and a copper electroplating layer are formed on one surface or both surfaces of an insulating layer through electroless copper plating and copper electroplating.

After the formation of the electroless copper plating layer and the copper electroplating layer, a dry film is applied on the copper electroplating layer, and then the portion of the dry film, other than the portion of the dry film corresponding to a circuit pattern, is removed through exposure and development.

Subsequently, the copper foil is etched using an etchant, thus forming the circuit pattern, after which the dry film remaining on the circuit pattern is removed therefrom.

After the preparation of the base plate 10, a first mask having a hole having a first size is placed on the portion of the base plate 10 at which the paste bump 20 is to be formed.

Next, a conductive paste is applied on the first mask, and is then pressed using a squeegee (S10).

Accordingly, the hole having a first size in the first mask is filled with the conductive paste, and the bottom of the conductive paste is stuck to the base plate 10 by the pressure of the squeegee.

After the filling of the hole having a first size in the first mask with the conductive paste, the mask is separated from the base plate 10. That is, the first mask, which is placed on the base plate 10, is removed.

Next, the conductive paste printed on the base plate 10 is dried through a drying procedure (S20).

After the drying of the conductive paste, the upper surface of the conductive paste, printed on the base plate 10, is flattened through coining, thus forming a first paste bump 20a having a first height h1 (S30).

After the formation of the first paste bump 20a, a second mask having a hole having a second size is placed on the first paste bump 20a so that the hole is at the same position as the first paste bump 20a, after which a conductive paste is applied on the mask.

The second mask has a hole, which has a size smaller than or equal to the hole in the first mask, and has a height, which is lower than or equal to the height of the first mask.

After the application of the conductive paste on the second mask, the conductive paste is pressed using a squeegee (S40).

Accordingly, the hole in the second mask is filled with the conductive paste, and the bottom of the conductive paste is stuck to the upper surface of the first paste bump 20a by the pressure of the squeegee.

After the printing of the conductive paste, the second mask, placed over the first paste bump 20a, is separated and removed.

Next, the conductive paste, printed on the first paste bump 20a, is dried through a drying procedure, thus forming a second paste bump 20b having a second height h2 (S50).

Because the second paste bump 20b is formed to have a height which is similar to that of the first paste bump 20a, specifically, lower than or equal to that of the first paste bump 20a, the paste bump 20 is formed to a predetermined height H.

After the formation of the paste bump 20 having a predetermined height H, an insulating layer is laminated on the base plate so that the paste bump passes through the insulating layer.

In this procedure, so-called B2it, by which an insulating layer is laminated on a base plate having a paste bump to thus form a paste bump board, is applied, and the insulating layer is perforated using a perforator for B2it, and is then laminated.

In the case where the paste bump is formed to have a height equal to or higher than that of the insulating layer, the insulating layer is laminated on the base plate, and then the paste bump is pressed using a press so that the height thereof is equal to that of the insulating layer.

Unless the paste bump is pressed, the paste bump protrudes from the surface of the insulating layer, so that a circuit pattern that is subsequently formed is not uniformly formed on the surface of the insulating layer, undesirably deteriorating the electrical properties of a PCB.

Conversely, in the case where the paste bump is formed to have a height lower than that of the insulating layer, the pressing of the paste bump is omitted.

After the pressing of the paste bump to thus flatten the surface of the insulating layer, the circuit pattern is formed on the insulating layer using a known technique.

After the formation of the circuit pattern, a plurality of insulating layers and circuit layers may be formed on the circuit pattern, depending on the end use of the PCBs.

In the method of fabricating the paste bump for a PCB according to the present invention, the conductive paste is printed once to thus form the first paste bump, the upper surface of which is flattened, after which the second paste bump having a height similar to that of the first paste bump is formed on the first paste bump, thus forming the paste bump having a desired height H, thereby decreasing the number of printings of the conductive paste.

Therefore, the method of fabricating the paste bump for a PCB according to the present invention can decrease the process time and process cost for the formation of the paste bump upon the fabrication of a PCB using B2it.

As described hereinbefore, the present invention provides a method of fabricating a paste bump for a PCB. According to the present invention, a conductive paste is printed once to form a first paste bump, the upper surface of which is flattened, after which a second paste bump having a height similar to that of the first paste bump is formed on the upper surface of the first paste bump, thus forming a paste bump having a desired height H. In this way, the number of printings of the conductive paste can be decreased.

Accordingly, in the present invention, the process time and process cost for the formation of the paste bump can be reduced upon the fabrication of a PCB using B2it.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a paste bump for a printed circuit board, comprising:
   preparing a base plate;
   printing a conductive paste on the base plate and drying the conductive paste on the base plate, thus forming a first paste bump;
   flattening an upper surface of the first paste bump through coining; and
   printing a conductive paste on the first paste bump and drying the conductive paste on the first bump, thus forming a second paste bump which has a height lower than or equal to that of the first paste bump,
   wherein the printing a conductive paste on the first paste bump and drying the conductive paste on the first bump comprises
   placing a second mask having a hole having a second size on the first paste bump;
   applying a conductive paste on the second mask, and pressing the conductive paste using a squeegee;
   filling the hole having a second size in the second mask with the conductive paste, and sticking a bottom of the conductive paste to an upper surface of the first paste bump; and
   removing the second mask, and drying the conductive paste, thus forming the second paste bump.

2. A method of fabricating a paste bump for a printed circuit board, comprising:
   preparing a base plate;
   printing a conductive paste on the base plate and drying the conductive paste on the base plate, thus forming a first paste bump;
   flattening an upper surface of the first paste bump through coining; and
   printing a conductive paste on the first paste bump and drying the conductive paste on the first bump, thus forming a second paste bump which has a height lower than or equal to that of the first paste bump,
   wherein the printing a conductive paste on the base plate and drying the conductive paste on the base plate comprises
   placing a first mask having a hole having a first size on the base plate;
   applying a conductive paste on the first mask, and pressing the conductive paste using a squeegee;
   filling the hole having a first size in the first mask with the conductive paste, and sticking a bottom of the conductive paste to the base plate; and
   removing the first mask and drying the conductive paste, thus forming the first paste bump.

3. The method as set forth in claim 1, wherein the hole in the second mask has a size smaller than or equal to the hole in the first mask.

4. A method of fabricating a paste bump for a printed circuit board, comprising:
   preparing a base plate;
   printing a conductive paste on the base plate and drying the conductive paste on the base plate, thus forming a first paste bump;
   flattening an upper surface of the first paste bump through coining; and
   printing a conductive paste on the first paste bump and drying the conductive paste on the first bump, thus forming a second paste bump,
   wherein the printing a conductive paste on the first paste bump and drying the conductive paste on the first bump comprises
   placing a second mask having a hole having a second size which has a size smaller than or equal to the hole in the first mask on the first paste bump;
   applying a conductive paste on the second mask, and pressing the conductive paste using a squeegee;
   filling the hole having a second size in the second mask with the conductive paste, and sticking a bottom of the conductive paste to an upper surface of the first paste bump; and removing the second mask, and drying the conductive paste, thus forming the second paste bump, wherein the second mask has a height lower than or equal to that of the first mask.

5. The method as set forth in claim 1, wherein the base plate is a laminate in which a circuit pattern is formed on one surface of an insulating layer.

6. The method as set forth in claim 1, wherein the base plate is a laminate in which a circuit pattern is formed on each of both surfaces of an insulating layer.

7. The method as set forth in claim 1, wherein the base plate is a metal carrier having a copper foil laminated on one surface thereof.

8. The method as set forth in claim 1, wherein the base plate is a copper foil.

9. The method as set forth in claim 2, wherein the base plate is a laminate in which a circuit pattern is formed on one surface of an insulating layer.

10. The method as set forth in claim 2, wherein the base plate is a laminate in which a circuit pattern is formed on each of both surfaces of an insulating layer.

11. The method as set forth in claim 2, wherein the base plate is a metal carrier having a copper foil laminated on one surface thereof.

12. The method as set forth in claim 2, wherein the base plate is a copper foil.

13. The method as set forth in claim 3, wherein the second mask has a height lower than or equal to that of the first mask.

* * * * *